United States Patent [19]
Ruile et al.

[11] Patent Number: 5,351,022
[45] Date of Patent: Sep. 27, 1994

[54] SURFACE ACOUSTIC WAVE REFLECTOR FILTER

[75] Inventors: Werner Ruile; Jürgen Machui, both of Munich; Giuliano Visintini, Unterhaching, all of Fed. Rep. of Germany

[73] Assignee: Siemens Aktiengesellschaft, Munich, Fed. Rep. of Germany

[21] Appl. No.: 862,566

[22] PCT Filed: Dec. 14, 1990

[86] PCT No.: PCT/EP90/02192
§ 371 Date: Jun. 22, 1992
§ 102(e) Date: Jun. 22, 1992

[87] PCT Pub. No.: WO91/09464
PCT Pub. Date: Jun. 27, 1991

[30] Foreign Application Priority Data
Dec. 20, 1989 [DE] Fed. Rep. of Germany ....... 3942148

[51] Int. Cl.$^5$ .............................................. H03H 9/64
[52] U.S. Cl. ................................. 333/195; 310/313 D
[58] Field of Search ............................... 333/193-195, 333/150, 153-155; 310/313 R, 313 B, 313 C, 313 D

[56] References Cited

U.S. PATENT DOCUMENTS

| 4,484,160 | 11/1984 | Riha | 333/195 |
| 4,520,330 | 5/1985 | Riha | 333/195 |
| 4,733,207 | 3/1988 | Peach | 333/194 X |
| 5,010,269 | 4/1991 | Hikita et al. | 333/195 X |

FOREIGN PATENT DOCUMENTS

| 1473661 | 5/1977 | Fed. Rep. of Germany . | |
| 201816 | 9/1991 | Japan | 333/195 |
| 2056809A | 3/1981 | United Kingdom . | |

OTHER PUBLICATIONS

Patent Abstracts of Japan, Band 8, Nr. 78 (E-237) (1515), Apr. 10, 1984 and JP, A, 58223912 (Nippon) Dec. 26, 1983 "Surface Acoustic Wave Filter".

Huang, Frederick, "Correction Factor for Low-Loss 180° Reflecting Linear Chirp Arrays in S A W Devices", 1988 IEEE, (pp. 61–65) *IEEE Transactions on Ultrasonics* vol. 35; No. 1, Jan. 1988.

*Primary Examiner*—Benny Lee
*Attorney, Agent, or Firm*—Hill, Steadman & Simpson

[57] ABSTRACT

An in-line surface-wave reflector filter having an input-/output transducer system (2, 12/4) in which direct acoustic signal transmission between input and output is eliminated.

7 Claims, 1 Drawing Sheet

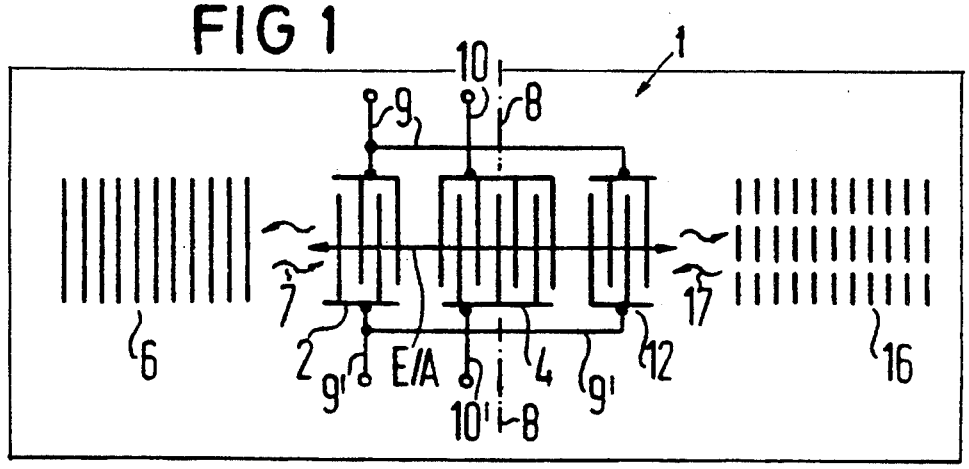
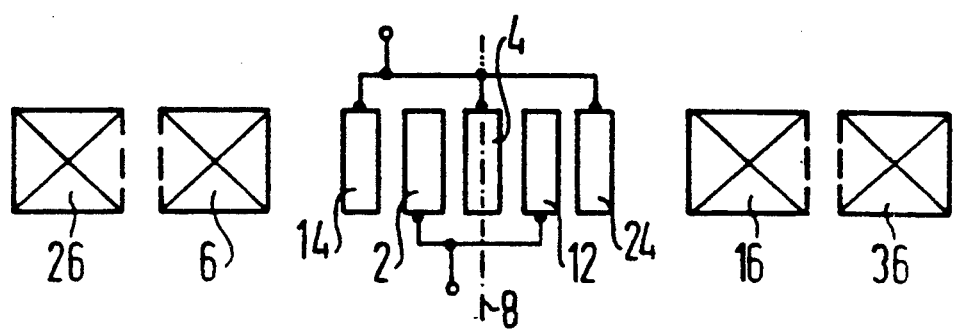
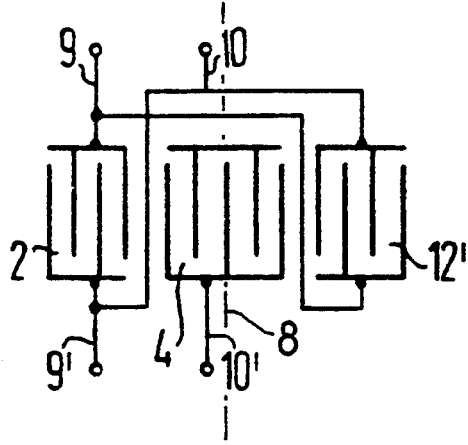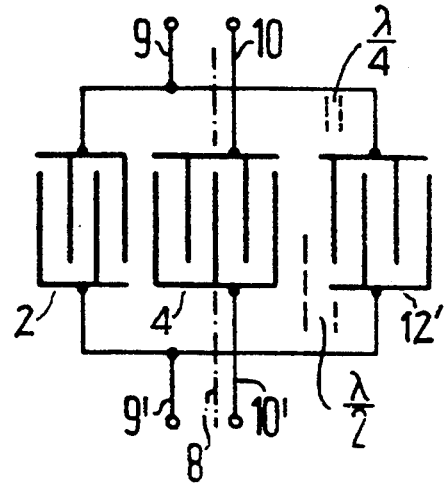

SURFACE ACOUSTIC WAVE REFLECTOR FILTER

BACKGROUND OF THE INVENTION

1. Field of the Invention

The present invention relates to a reflector filter operating with surface acoustic waves, having at least one input transducer, at least one output transducer and at least one reflector structure. The reflector structure(s) acts (act) as a 180° reflector, and the input transducer, output transducer and reflector structure are arranged in-line on the surface acoustic wave substrate.

The U.S. Pat. Nos. 4,484,160 and 4,520,330 disclose a surface acoustic wave reflector filter, known as a RAC filter, having an input transducer, an output transducer and two reflector structures which, with reflector fingers positioned obliquely, face each other (lying next to one another) in such a way that an acoustic wave proceeding into one reflector is deflected by approximately 90° and proceeds into the other reflector. The acoustic wave is deflected by this second transducer with an approximately 90° change of direction to the output transducer. A filter of this type is suitable for use to define a time window, or time span for monitoring events, for example. The finger structures of the aforesaid reflectors can be weighted and/or dispersive in accordance with the desired transmission function. In particular, finger displacement weighting, finger omission weighting and finger rotation can be provided as finger weighting. A substrate with a reduced length is required for such a surface acoustic wave reflector filter since, despite the considerable length of the reflectors, no substrate length corresponding to a conventional in-line arrangement is required as a result of the folded acoustic path.

A disadvantage of a reflector filter of this type is that there is a certain temperature dependency of the angle accuracy of the 90° reflection, even in the case of a substrate made of quartz. A filter of this type also has a certain amount of transmission losses.

It is important for such a surface acoustic wave reflector filter that the transmission of the electrical input signal into the electrical output signal of the filter is effected in practice solely via the path of the acoustic wave, to be precise via the reflector(s). A direct signal transmission between an input transducer and an output transducer, that is to say circumventing the reflector structure(s), must in practice be precluded, even if said direct transmission between the input transducer and the output transducer occurs on an acoustic path. This is usually the case with resonator filters. In a resonator filter, the resonant property of the overall filter arrangement primarily determines the essential characteristic of such a filter, namely for the formation (bandwidth, group delay and the like) of its passband.

A relevant reflector filter whose essential characteristic of the passband is determined by the property of the reflector as such must be distinguished from a resonator filter here. Resonances of the entire filter arrangement must be avoided in a reflector filter.

A one-track reflector filter is known from IEEE Trains. Ultrasonics, Vol. 35 (1988), pages 61 ff, FIG. 3d. The reflector filter has an output transducer and an input transducer with transducer fingers positioned obliquely to the longitudinal axis of the filter, the oblique position of the one transducer being opposite to that of the other. The electrodes, oriented orthogonally to this axis, of the two reflectors reflect the acoustic waves propagating in the filter at an angle deviating from 180°. The intention of this reflector filter with obliquely positioned transducer fingers is to minimize a direct acoustic signal transmission from the input transducer to the output transducer. The wave cancellation effect leading to this minimization is however dependent on the wavelength there, so that this result can only be achieved for a narrowband wavelength range. The oblique positioning of the transducer fingers provided also leads to additional losses. Such a reflector filter is difficult to calculate due to the obliquely oriented wave fronts occurring.

SUMMARY OF THE INVENTION

The object of the present invention is to provide a reflector filter operating with surface acoustic waves which is easy to calculate and whose properties, including the reflection, exhibit an optimum temperature independency with the necessary substrate body being of the smallest possible size, in relation to the specified requirements with respect to selectivity as reflector filter, and if appropriate the filter also exhibiting thereby a minimum loss of signal energy (low loss). The filter should have as low acoustic crosstalk as possible.

This object is achieved with a reflector filter operating with surface acoustic waves which has a substrate, an input transducer and an output transducer, a single 180° reflector which is arranged for the acoustic coupling of the input transducer and output transducer to one another, these elements being arranged along a main propagation direction of the filter, and in particular, of the input transducer and the output transducer, at least one of which is constructed as a transducer configuration, such a transducer configuration consisting of a plurality of individual transducers, the input transducer and the output transducer being arranged about a common center of said input/output transducer system as an axis of the same perpendicular to the main propagation direction, wherein one of the transducers acts antisymmetrically to the axis and the other transducer thereof acts symmetrically to the axis so that the signals fed by the input transducer to the output transducer on a direct path are canceled and so that the signal is transmitted via the reflector, and input transducer and output transducer and the reflector lying on the one single common acoustic main propagation direction of the filter.

Alternately, the surface-wave reflector filter has a substrate, an input transducer and an output transducer, at least two 180° reflectors which are arranged for the acoustic coupling of input transducer and output transducer to one another, these elements being arranged along a main propagation direction of the filter and, in relation to the main propagation direction, in each case at least one reflector is arranged on either side of the transducers, in particular, of input the transducer and the output transducer, at least one of which is constructed as a transducer configuration such a transducer configuration including a plurality of individual transducers, the input transducer and the output transducer being arranged about a common center of the input-/output transducer system as the axis of the same perpendicular to the main propagation direction, wherein one of the transducers acts antisymmetrically to the axis and the other transducer thereof acts symmetrically to said axis so that the signals fed by the input transducer to the output transducer on a direct path are canceled and so that the signal is transmitted via the reflector, and the input transducer and the output transducer and all reflectors lie on the one single common acoustic main propagation direction of the filter, and the distance of the reflector immediately adjacent to the axis on the one side of the axis in relation to the distance of the reflector immediately adjacent to the axis on the other side of the axis is dimensioned to be different in the substrate by an odd multiple of a quarter of the acoustic wavelength lambda. Further advantageous refinements of such a filter are realized when both input the transducer and the output transducer are each a transducer configuration. The filter have the antisymmetrical effect relative to the axis of one of the transducer configurations with an even number of individual transducers achieved by an antisymmetrical electrical connection of the individual transducers to one another within the transducer configuration, the individual transducers of the transducer configuration being symmetrical to the axis both geometrically and constructionally. Instead, the filter may have the antisymmetry of the respective transducer configuration as the result of a displacement by an odd multiple of half the acoustic wavelength lambda in the substrate relative to the axis.

Within the meaning of the invention, "surface waves" are understood to be acoustic waves that propagate in or near the surface of a solid (substrate), which are more specifically specified as Rayleigh waves, Bleustein waves, SSBW waves (surface skimming bulk waves) and the like, and the occurrence of which in each case is dependent on the respective orientation of the crystal direction of the substrate and the arrangement of the surface wave structures relative to one another.

An essential feature of a filter according to the invention is the one-track in-line arrangement of the input transducer, output transducer and reflector structure arrangements, wherein the at least one reflector present reflects the acoustic wave back into itself at an angle of exactly 180°. This makes it easy to calculate the filter using standard methods and avoids temperature dependencies of filters with reflection other than 180°. An essential further feature of the filter according to the invention is the use of multiple transducer arrangements referred to here as "mutually blind transducers (MBT)". Further details of an MBT arrangement according to the invention emerge from the description of the exemplary embodiments below.

In the simplest case a filter according to the invention consists of an input transducer arrangement, an output transducer arrangement and a reflector structure, wherein in the simplest case the aforesaid transducer arrangements consist of two input transducers and one output transducer or of one input transducer and two output transducers (and these three transducers have the MBT characteristic).

BRIEF DESCRIPTION OF THE DRAWINGS

FIG. 1 shows a simple exemplary embodiment and the basic principle of a filter according to the invention, and FIGS. 2, 3 and 4 show further refinements with multiple structures for the input transducer and output transducer and/or reflector structures in each case.

DETAILED DESCRIPTION OF THE PREFERRED EMBODIMENTS

The filter 1 according to FIG. 1 has two transducers 2 and 12 which serve as input transducers and a transducer 4 which serves as an output transducer. Element 6 denotes a reflector structure reflecting surface waves back into itself (exactly 180°). The main wave propagation direction in the filter 1 is denoted by the axis E/A. The axis is also the in-line axis of the filter. Element 7 denotes the acoustic wave proceeding in two opposite directions parallel to the axis.

The transducers 2, 12 and 4 are together defined here as a "transducer system". This transducer system has a common mid-line, which is indicated and denoted by the axis 8. The axis 8 "divides" the output transducer 4 into two mirror-symmetrical halves. The input transducers 2 and 12 connected to the signal input terminals 9, 9' act antisymmetrically with respect to the output transducer 4. With the manner of connection illustrated, the finger structures of the transducers 2 and 12 which are asymmetrical with respect to the axis 8 cause the signals starting from the transducers 2 and 12 and fed to the output transducer 4 acoustically on a direct path to be canceled as phase-opposed in the output transducer 4. Thus, no signal proceeds from the terminals 9, 9' on the "direct" or immediate acoustic path into the output terminals 10, 10' of the output transducer.

This is different for an acoustic signal transmission from the transducer 2 via the reflector structure 6 into the output transducer 4, namely via the acoustic path 7. An output signal is to be obtained at the terminals 10, 10' via the reflector structure 6. The signal transmitted via the reflector structure 6 is the filter output signal essentially determined with respect to its characteristic by the resonator structure 6, which output signal (ideally) does not contain any signal component of a direct acoustic crosstalk.

An in-line filter of this type has advantages, namely that there is greater freedom in the selection of the design for such a filter, that is to say the transducers are self-adjusting and the reflector alone determines the frequency response. Moreover, the in-line filter according to the invention can also be realized in an optimum space-saving manner on the substrate. In addition, the substrate does not require a particularly high coupling factor here, as is required for arrangements with multi-strip couplers. Good analysis programs are available for a filter according to the invention and its design is very similar to that of a transversal filter.

Virtually no losses occur in the reflector, so that a filter according to the invention can also be used to this extent as a low-loss filter. FIG. 1 also contains, indicated with a dashed line, a further reflector 16 which, in relation to the transducer system 2, 12 and 4 and in relation to the wave propagation direction E/A of the reflector structure 6, is arranged lying opposite the structure 6 on the substrate. In accordance with the acoustic path 17, an acoustic wave also proceeds from the input transducer 12 into the reflector structure 16 and back into the output transducer 4. The acoustic length of the path from the input transducer 12 via the reflector structure 16 into the output transducer 4 on one hand, and the acoustic length from the input transducer 2 via the reflector structure 6 into the output transducer 4 on the other hand are selected relative to one another in such a way that the two acoustic waves reaching the output transducer 4 (from the reflector structure 6 and from the reflector structure 16) are amplified in said output transducer 4. For this purpose, the appropriate matching of the finger arrangements of the transducers and of the reflector structures must be taken into account in a manner known per se, which is an easy matter for a person skilled in the art. An arrangement of this type must not be confused with a resonator filter, in which resonances are required between the reflectors arranged at the respective end of the resonator filter.

A reflector filter according to the invention must also not be confused with an arrangement according to Japanese Published Application 58-223912. A filter arrangement disclosed in this Laid-open Publication does not have the above-mentioned distance relationship between the respective reflector structure and its adjacent transducer, as is absolutely necessary for the latter described second embodiment having an additional reflector 16. In the arrangement according to the aforesaid Japanese Laid-open Publication, the two reflector structures arranged adjacent to a transducer in each case are provided in order to make the respective transducer a unidirectional transducer. Moreover, the two existing combinations of transducer and associated reflector would not fulfil the above distance condition according to the invention. The combination of transducers is also not an MBT arrangement, as otherwise the arrangement would not supply any output signal.

Such a filter with reflector structures 6 and 16 has extremely low losses, since in practice all the acoustic energy of the input transducers 2, 12 via the reflectors 6, 16 is effective in the output transducer 4 as filter output signal.

The transducer system of FIG. 1 has, as illustrated, a symmetrical output transducer and input transducers 2, 12 which are designed to be antisymmetrical to one another, and which are electrically connected to one another in accordance with the terminals 9, 9′ in such a way that said antisymmetrical effect is not canceled. Analogously, the transducers 2, 12′ could also be designed symmetrically with respect to the axis 8, and their busbars are electrically connected cross-wise to one another, as is shown in FIG. 2. The distances between the transducer 4 on the one hand and the transducer 2 and the transducer 12 respectively on the other hand are the same or differ by multiples of lambda for phase equality.

Instead of the cross-wise connection, it may also be provided in accordance with FIG. 3 that the distance between the symmetrical output transducer 4 and one input transducer 2 on the one hand, and the distance between the output transducer 4 and the second (toward the center 8) symmetrical transducer 12′ is made to differ by an odd multiple of half of the wavelength ($\lambda/2$) or one-quarter of the wavelength ($\lambda/4$) of the acoustic wave. The embodiments of FIGS. 2 and 3 are also provided with signal input terminals 9 and 9′.

In the embodiments according to FIGS. 2 and 3, as well, measures lead to the fact that no resultant signal arrises in the output transducer 4 or at its terminals 10, 10′ respectively on the direct acoustic path from the input transducer pair 2, 12′.

A transducer configuration consisting of the two input transducers 2 and 12 is provided for the exemplary embodiment of FIG. 1, whereas the output transducer 4 is a single transducer. The same result is obtained if an output transducer configuration consisting of two transducers and a single input transducer is provided, if only the above-described phase relationships with respect to the "direct" acoustic path, that is the say the acoustic path "circumventing" the resonator structures, are maintained. The terminal pair 9, 9′ and the terminal pair 10, 10′ can be swapped with one another with respect to the input and output of the filter.

An input or output transducer configuration consisting of two transducers together with an output or input transducer configuration consisting of three transducers can also be used if the phase relationships are again likewise fulfilled. FIG. 4 shows the diagram of such an embodiment of an MBT arrangement for the invention. The transducers of the one transducer configuration are denoted by 2 and 12 and the transducers of the other transducer configuration are denoted by 4, 14 and 24. The transducer configurations again have a common mid-line 8. Embodiments of a filter according to the invention with such transducer configurations consisting of a plurality of transducers are suitable for obtaining a greater bandwidth. FIG. 4 additionally shows further reflectors 26, 36. The two reflectors 6, 26 and 16, 26 each form a known resonant cavity. A center axis is also shown in FIG. 4.

Although other modifications and changes may be suggested by those skilled in the art, it is the intention of the inventors to embody within the patent warranted hereon all changes and modifications as reasonably and properly come within the scope of their contribution to the art.

I claim:

1. A surface acoustic wave reflector filter comprising:
   a substrate for propagation of surface acoustic waves;
   an input transducer disposed on said substrate;
   an output transducer disposed on said substrate;
   a single 180° reflector disposed on said substrate and which is arranged for acoustically coupling surface acoustic wave signals between said input transducer and said output transducer;
   said filter defining a main propagation direction for surface acoustic wave signal propagation along which said input and output transducers and said reflector are disposed;
   both of said input and output transducers having a respective transducer configuration, each transducer configuration comprised of a plurality of individual transducers, each said input transducer configuration and each said output transducer configuration being arranged in an input/output transducer system and sharing a common mid-line, said common mid-line coinciding with a middle axis of said input/output transducer system, said middle axis being oriented perpendicularly to the main propagation direction, one of said input and output transducer configurations being oriented substantially asymmetrically relative to said middle axis and another of said input and output transducer configurations being oriented substantially symmetrically relative to said middle axis; and
   wherein a surface acoustic wave propagating along said propagation direction from said input transducer to said output transducer in a first direction along a direct path between said input and output transducers is cancelled and wherein a surface acoustic wave propagating along said main propagation direction in a second direction, opposite said first direction, is transmitted via one of said reflectors back to said output transducer.

2. A filter as claimed in claim 1, wherein the antisymmetrical orientation relative to the middle axis of said one of the transducer configurations has an even number of individual transducers, said antisymmetrical orientation is achieved by antisymmetrical electrical connection of said even number of individual transducers to one another within the transducer configuration, while said individual transducers of said transducer configuration being arranged symmetrical to the middle axis.

3. A filter as claimed in claim 1, wherein the antisymmetrical orientation of the respective tranducer configuration is a displacement by an odd multiple of half the acoustic wavelength lambda in the substrate relative to the middle axis.

4. A surface acoustic wave reflector filter comprising:
a substrate for propagation of surface acoustic waves;
an input transducer disposed on said substrate;
an output transducer disposed on said substrate;
two 180° reflectors disposed on said substrate and which are arranged for acoustically coupling surface acoustic waves between said input transducer and said output transducer;
said filter defining a main propagation direction for surface acoustic wave propagation along which said input and output transducers and said two 180° reflectors are arranged;
each of said two 180° reflectors being disposed on either side of said input and output transducers proceeding in the main propagation direction;
both of said input and output transducers having a respective transducer configuration, each transducer configuration comprised of a plurality of individual transducers, each said input transducer configuration and each said output transducer configuration being arranged in an input/output transducer system and sharing a common mid-line, said common mid-line coinciding with a middle axis of said input/output transducer system, said middle axis being oriented perpendicularly to the main propagation direction, one of said input and output transducer configurations being oriented substantially asymmetrically relative to said middle axis and another of said input and output transducer configurations being oriented substantially symmetrically relative to said middle axis;
wherein a surface acoustic wave propagating along said propagation direction from said input transducer to said output transducer in a first direction along a direct path between said input and output transducers is cancelled and wherein a surface acoustic wave propagating along said main propagation direction in a second direction, opposite said first direction, is transmitted via said reflector back to said output transducer; and
a distance of one of said two 180° reflectors immediately adjacent to the middle axis on one side of said middle axis in relation to a distance of another of said two 180° reflectors immediately adjacent to the middle axis on another side of said middle axis being respectively different by an odd multiple of a quarter of a wavelength of said surface acoustic wave.

5. A filter as claimed in claim 4, wherein the antisymmetrical orientation of the respective transducer configuration is a displacement by an odd multiple of half the acoustic wavelength lambda in the substrate relative to the middle axis.

6. A filter as claimed in claim 4, wherein both of said input transducer and output transducer are each of said transducer configuration.

7. A filter as claimed in 4, wherein the antisymmetrical orientation relative to the middle axis of said one of the transducer configurations having an even number of individual transducers, said antisymmetrical orientation is achieved by antisymmetrical electrical connection of said even number of individual transducers to one another within the transducer configuration, while said individual transducer of said transducer configuration being arranged symmetrical to the middle axis.

* * * * *